INVENTORS.
ROBERT J. DOMENICO
ROBERT H. F. LLOYD
BY Peter R. Leal
AGENT

United States Patent Office 3,460,010

Patented Aug. 5, 1969

3,460,010

THIN FILM DECOUPLING CAPACITOR INCORPORATED IN AN INTEGRATED CIRCUIT CHIP, AND PROCESS FOR MAKING SAME

Robert J. Domenico, Saratoga, and Robert H. F. Lloyd, Sunnyvale, Calif., assignors to International Business Machines Corporation, Armonk, N.Y., a corporation of New York Filed May 15, 1968, Ser. No. 729,305

Int. Cl. H01l 19/00

U.S. Cl. 317—235 14 Claims

ABSTRACT OF THE DISCLOSURE

A novel thin film decoupling capacitor is incorporated in the unused side of an integrated circuit chip, one side of said capacitor comprising a metallic film, the second side of said capacitor comprising semiconductor columns of a first conductivity type embedded in a semiconductor substrate of a second conductivity type. The surface of said columns adjacent said metallic film are indented and have a dielectric material contained in the indentations. The metallic plane is in contact with the dielectric material and also with portions of the bottom surface of the supbstrate adjacent said indentations. A low resistance contact to the columnar side of the capacitor is made by forming a semiconductor layer of the same conductivity type as said columns over the top of said substrate, forming a second semiconductor layer of the opposite conductivity type to said first layer over said first layer, and forming a conductive path of the same conductivity type as said first layer from the top of said second layer to said first layer. Thus, a low resistance contact is made from the top of said second layer, where the integrated circuits themselves will be located, to the columnar side of the capacitor. A novel process for making the described semiconductor body is included, comprising a series of diffusion steps including controlled out-diffusions of buried diffusions.

RELATED APPLICATIONS

This application is related to the applications entitled "Power Connections in Integrated Circuit Chip, No. 697,-732, by Fred A. Reid, and "Process for Making Separate Semiconductor Bodies Having Power Connections Internal Thereto," No. 697,731, by Robert H. F. Lloyd, et al., both said applications filed January 15, 1968, and assigned to the assignee of the present invention.

BACKGROUND OF THE INVENTION

Field of the invention

This invention relates to decoupling capacitors in integrated circuitry, and in particular to a novel thin film decoupling capacitor incorporated in an integrated circuit chip, and a process for fabricating same.

Description of the prior art

The field of large scale integrated circuitry has recently been increasing at a rapid rate. In the technology there is a continuing and evergrowing need for incorporating in said circuit the capacitors necessary for decoupling purposes in the operation of such circuitry. This need has been filled in the past by the use of various forms of PN junction capacitors. The incorporation of thin film decoupling capacitors in an integrated circuit chip has also been attempted. However, prior art thin film decoupling capacitors incorporated in an integrated circuit chip would suffer from the shortcomings of greatly increasing the fragility of the chip, or of the wafer from which the chip is ultimately cut, and of preventing good thermal contact from the integrated circuit chip to its mounting surface. Such prior art approaches would also present shorting problems, require critical alignment, and often present a great risk of damaging the dielectric film during handling and joining. A further disadvantage of prior art thin film capacitors is the great difficulty in achieving reasonably low resistance and inductance connections from one side of the capacitor to the circuits on the integrated circuit chip.

SUMMARY OF THE INVENTION

It is an object of this invention to achieve an improved thin film decoupling capacitor incorporated in an integrated circuit chip.

It is another object of the present invention to provide a thin film decoupling capacitor in an integrated circuit which does not suffer from edge shorts and requires no critical alignment.

It is yet another object of this invention to provide a thin film decoupling capacitor in an integrated circuit chip which does not greatly increase the fragility of the chip or of the wafer from which it is ultimately cut.

It is still another object of this invention to provide a thin film decoupling capacitor in an integrated circuit chip which allows good thermal contact from the integrated circuit chip to its mounting surface.

It is a further object of this invention to provide an improved thin film decoupling capacitor in an integrated circuit chip which minimizes the risk of damaging the dielectric film of the capacitor during handling and joining.

According to one aspect of the invention, a thin film decoupling capacitor is incorporated in the unused side of an integrated circuit chip, the opposite side of the chip being used to carry the integrated circuits. One side of the capacitor comprises a metallic plane. The second side of the capacitor comprises columns of semiconductor material of a first conductivity type embedded in a semiconductor substrate of a second conductivity type, said substrate ultimately forming a part of the integrated circuit chip. The said second side of the capacitor comprising columns of semiconductor material will hereinafter be referred to as the columnar side of the capacitor. The surface of each column which is adjacent the metallic plane is concavely indented such that the unused side of the substrate assumes a waffle-like appearance. The indentations have dielectric material contained therein. Portions of the semiconductor substrate within which the columns are embedded are in contact with the metallic plane which comprises the first side of the capacitor. Thus, the capacitor comprises the metallic plane as a first side, the dielectric material within the indentations, and the semiconductor columns as the columnar side. A low resistance contact is made to the columnar side of the capacitor by forming over the top of the substrate into which said columns are embedded a layer of semiconductor material of the same conductivity type as said columns. A second semiconductor layer of the opposite conductivity type to said first layer is then formed over said first layer. The individual integrated circuits will ultimately be formed in this second semiconductor layer. Finally, a low resistance conductive path, of the same conductivity type as the first layer, is formed from the top of this second layer into the first layer thus making contact to the columnar side of the capacitor. The metallic plane side of the capacitor can be conductively connected to a first power supply via a metallic substrate. This power supply can then be brought to the circuit surface of the integrated circuit chip by diffused semiconductor collar internal to and about the periphery of said chip. Such a collar is described in the two related co-pending applications cross-referenced above.

A novel process for fabricating the described semiconductor body of the present invention includes the steps of obtaining a heavily doped semiconductor substrate of the said second conductivity type, and forming therein the semiconductor columns by performing a series of deep single-sided diffusions or, alternatively, douple-sided diffusions. A low resistance, low inductance contact is made from the embedded columns to the circuits at what will ultimately be the top of the integrated circuit chip by a series of epitaxial growth and diffusion steps. These include growing a first epitaxial layer of said first conductivity type over the top surface of said substrate. A second epitaxial layer of said second conductivity type is formed over the first epitaxial layer. Individual circuit elements are fabricated in this second epitaxial layer. Concurrent with the growth of the epitaxial layers, a low resistance, low inductance semiconductor collar can be formed for ultimate use in bringing a power supply from the bottom side of said chip to the circuits located on said top side. The above mentioned low resistance, low inductance semiconductor path is formed from the top of said second epitaxial layer to said first epitaxial layer. Circuit points to be decoupled are attached to the surface of said second epitaxial layer in areas including said low resistance, low inductance paths. Steps of buried diffusions and controlled out-diffusion of said buried diffusions can be utilized in the formation of said low resistance, low inductance paths and also in the formation of said semiconductor collar. The completion of fabrication of the capacitor itself then includes etching depressions or indentations into the bottom surface of the substrate, each depression including, and larger in area than, one of said previously diffused semiconductor columns of said conductivity type. The indentation is such that the resulting PN junction at the surface of the indentation is well away from the edge of the hole. Dielectric material is then placed over the total bottom surface of the substrate preferably by an evaporation technique. The dielectric material is then lapped off the bottom surface of the substrate such that just the indentations remain filled with dielectric and the planar section of the substrate is substantially free of dielectric. The metal side of the capacitor is then formed by metallizing the bottom surface of the resulting structure. This metallized bottom surface will subsequently be joined to a metallic substrate such as molybdenum which may be used for connection to a first power supply.

BRIEF DESCRIPTION OF THE DRAWINGS

The foregoing and other objects, features, and advantages of the invention will be apparent from the following more particular description of a preferred embodiment of the invention, as illustrated in the accompanying drawings wherein.

Figure 1:
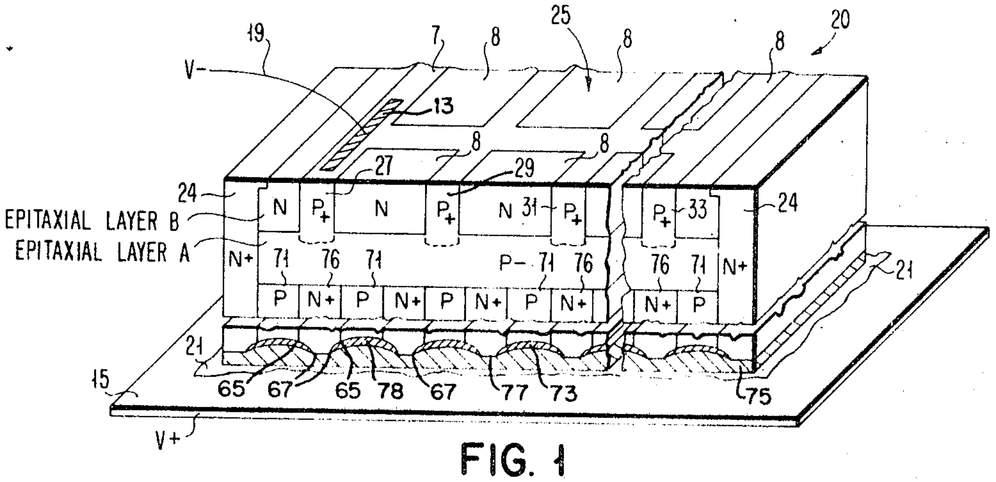
FIG. 1 is an isometric view showing the thin film capacitor incorporated in the unused side of an integrated circuit chip.

Similar numerals refer to similar elements throughout the drawing. In this application, semiconductor material of the first semiconductor type will be referred to as P type semiconductor material while semiconductor material of the second conductivity type will be referred to as N type semiconductor material. It will be recognized by those skilled in the art that although the invention is described with certain parts being of P type material and certain other parts being of N type material, these parts can be reversed in conductivity type depending upon the type of circuit elements used on the integrated circuit chip (such as NPN or PNP transistors) and corresponding voltage polarities.

DESCRIPTION OF PREFERRED EMBODIMENT

With reference to FIG. 1, there is seen an isometric view of a preferred embodiment of the thin film capacitor incorporated in the unused side of an integrated circuit chip. The integrated circuit chip is seen generally at 20. The top surface of the chip is seen at 25. Portions 8 of top surface 25 will contain individual circuits and circuit elements, not shown. It will be appreciated that although only a few portions 8 are shown, for clarity, there will in general be a number of these portion such that there may be a great number of individual circuits over the top surface 25 of the chip 20.

Figure 3:
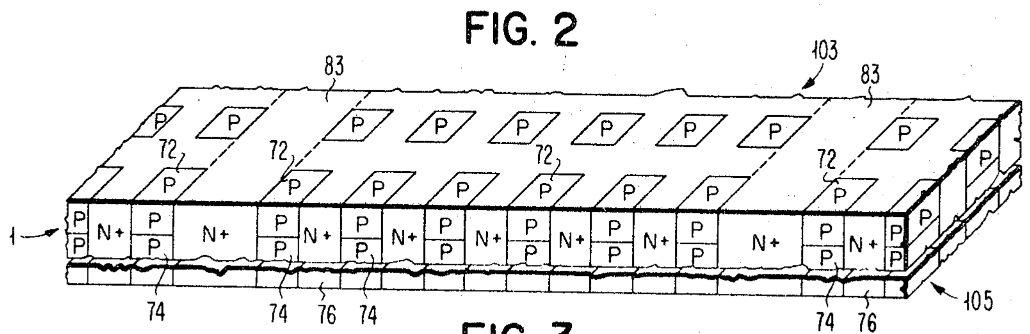
FIG. 3 is a broken isometric view of the semiconductor substrate or wafer of FIG. 2 showing the columns of a first conductivity type embedded therein.

With continued reference to FIG. 1, there is seen, in front view, P type columns 71 embedded within an N+ substrate, portions of which are seen at 76. Skipping ahead momentarily to FIG. 3, an isometric view of the P type columns 71 is seen embedded in the N+ substrate indicated generally at 1 and having a top surface 103 and a bottom surface 105. P type semiconductor columns 71 are shown in FIG. 3 to be diffused into substrate 1 so as to be embedded therein. Thus, it is seen that N+ portions 76 of FIG. 1 are actually a part of the N+ substrate seen in a vertical plane view and that the P type semiconductor columns 71 of FIG. 1 are actually a vertical plane view of the columns seen embedded in substrate 1 of FIG. 3.

Referring again to FIG. 1, it is seen that the bottom surface of the substrate has concave indentations 78 which each include one of the P type columns 71 and parts of the N type substrate surrounding the column. The indentations may be of circular or other desired cross section. As can be visualized from FIG. 1, the bottom side of the substrate will then have the appearance of a waffle with the regions 78 being the identations in the waffle and the N+ regions 77 being the ridges of the waffle. The indentations 78 are larger than each column 71 such that the resulting PN junction such as 65 is well away from the edge 67 at the planar surface of the substrate. This will minimize the danger of edge shorts. Each indentation has dielectric material 73 contained therein. It is to be noted that the ridges 77 of the waffle-like structure are substantially free of dielectric material and are in contact with metallic thin film 75. Metallic thin film 75 is conductively bonded via bond 21 to a metallic substrate 15 which may be, for example, molybdenum. Metallic substrate 15 can be connected to a power supply V+, which can be one of the power supplies to be decoupled by the decoupling capacitor. The power supply, V+, can be brought to the top 25 of the chip by diffused semiconductor collar 24 for distribution to the circuits which will be located on said top surface. Thus, the capacitor comprises a first metallic side 75, a second columnar side comprising indented P type semiconductor columns 71, with dielectric 73 in said indentations between said first metallic side and said columns. It is to be noted that ridges 77 of the N+ substrate are in contact with the metallic plane 75. This aspect of the structure lends strength to the structure, relative to prior art thin film capacitors, in that it does not greatly increase the fragility of the chip or the wafer from which it is fabricated. Further, this aspect allows good thermal contact from the integrated circuit chip to its mounting surface. It will also be appreciated that the structure as described thus far minimizes the risk of damaging the dielectric film of the capacitor during handling and joining of the metallic plane 75 to the metallic substrate 15. A low resistance, low inductance connection is made from the top surface 25 of the chip to the columnar side of the capacitor via epitaxial layer A which comprises P— type epitaxy. A second epitaxial layer B, comprising N type epitaxy, is formed over the epitaxial layer A. Circuit elements will ultimately be fabricated in epitaxial layer B. A low resistance path including paths 27, 29, 31, 33 of P type semiconductor material extends from the top surface of epitaxial layer B to epitaxial layer A. It will be seen that these paths also serve to isolate portions 8 of epitaxial layer B. It is these portions 8 in which individual circuit elements will be fabricated. Although only six such portions are shown, it will be appreciated by the break points in epitaxial layer B that any number, according to choice, can be provided. Likewise, any number of low resistance paths desired can also be provided. A second voltage to be decoupled, V—, can be brought to surface 25 at metal deposition 13 which is deposited in areas included in said low resistance path. As mentioned previously, the first voltage V+ was brought to top surface 25 by means of diffused semiconductor collar 24. Means for distributing both voltages to the circuits of the chip are described and shown in the above reference co-pending related applications. Circuit points to be decoupled in the circuits fabricated from portions 8 can be connected to the low resistance connecting paths.

Figure 2:
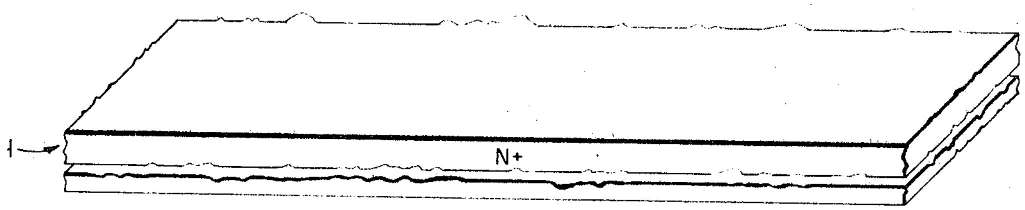
FIG. 2 is an isometric broken view of the substrate or semiconductor wafer within which the columnar side of the capacitor will be formed.

A novel process for fabricating the thin film capacitor incorporated in an integrated circuit chip according to the invention will now be described. This description will also serve to highlight significant factors of the structure of the capacitor. With reference to FIG. 2, there is seen a highly conductive semiconductor substrate 1 of N+ conductivity type. It is desirable to obtain as high a conductivity as possible, and arsenic doped silicon has been found to be suitable material for substrate 1. Other materials can of course be used without departing from the spirit and scope of the invention. The conductivity of substrate 1 utilizing arsenic doped silicon may be, for example, .001 ohm-centimeter. Subtrate 1 might be, for example, 10 to 15 mils thick. Substrate 1 is shown in broken form to indicate that its thickness is in the order of mils while layers A and B are in the order of microns.

Referring to FIG. 3, it is seen that the next step is to form P type semiconductor columns through the N+ type substrate 1. This might be done by diffusing the columns into the substrate material utilizing well-known masking techniques using, for example, silicon dioxide diffusion masks formed by etching through photo-sensitive polymer masks. Since diffusion techniques are well-konwn in the prior art, they will not be discussed further here. However, for more diffusion technique information, the reader is referred to the article "A Survey of Diffusion Processes for Fabricating Integrated Circuits" by Duffy and Gnall, in the text Microelectronic Technology, Boston Technical Publishers, 1967, pages 83–92. The P material diffusion can be of two types. Either a single deep diffusion into or through the N+ substrate 1 can be made to form P type columns. These columns may or may not extend entirely through substrate 1, but must be deep enough to be reached by the indentations described subsequently relative to FIG. 9. Alternatively, a double sided diffusions 72, 74 can be made to form the P type columns as seen in FIG. 3. In either case, P type columns 71 embedded in the substrate 1 will result. A difference between the two techniques is that the diffusion time for the double sided diffusion will be less than for the single sided diffusion. If a double sided diffusion is used, both sides may be masked and the diffusion carried out simultaneously. It will be noted that portions 83 of substrate 1, as seen in FIG. 3, are not used for column diffusions. These portions 83 will be the portions from which the diffused semiconductor collar will extend upward to the top of the completed chip. It will be appreciated by those skilled in the art that what is shown in FIGS. 2–12 is fabrication according to the invention in a portion of a single wafer. Many integrated circuit chips may be fabricated from a single and later scribed and cut to form the individual integrated circuit chips such as that seen in FIG. 1.

Figure 4:
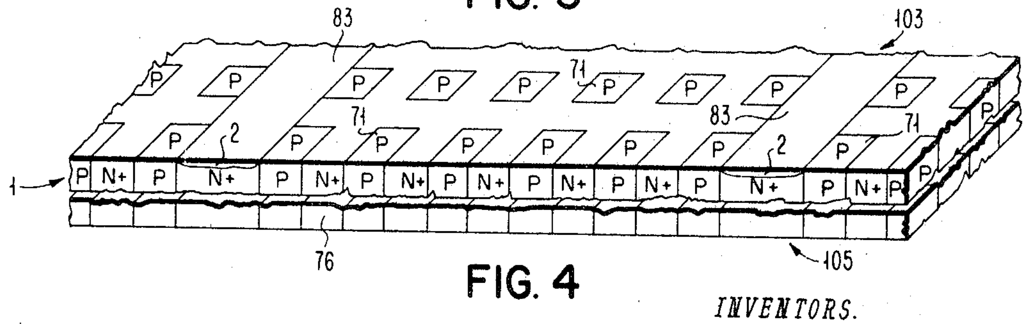
FIG. 4 is the same as FIG. 3 with the inclusion of buried diffusions used in the fabrication of said diffused semiconductor collars.

Referring now to FIG. 4, there is seen the next step in the process. As seen in that figure, a first plurality of channels 2 of N+ conductivity type is formed by diffusion of, for example, phosphorus into areas 83 of substrate 1. These plurality of channels 2 will contain the boundaries of adjacent integrated circuit chips which will later be cut from the wafer. As will subsequently be seen, the conductive collar will diffuse in regions defined by these first plurality of channels 2.

Figure 5:
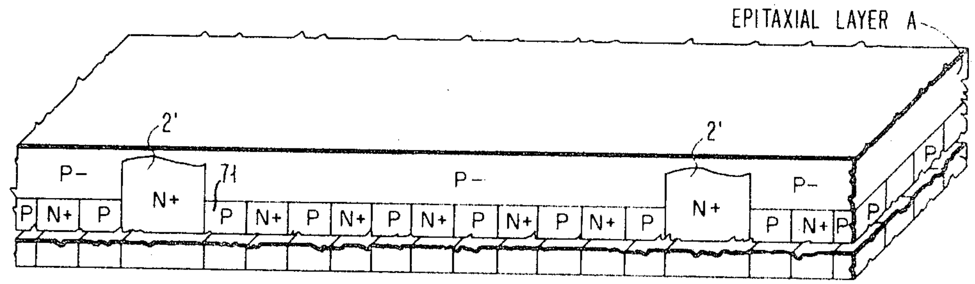
FIG. 5 is the same as FIG. 4 but additionally showing the formation of a first epitaxial layer, and the results of controlled out-diffusions in the fabrication of the diffused semiconductor collars.

Referring to FIG. 5, there is seen the next step in the process wherein the beginning of the low resistance, low inductance contact to the columnar side of the capacitor takes place. As seen in that figure, a first epitaxial layer, A, is formed over the thus far described structure so as to cover the P columns which are embedded in the substrate, and also to cover the plurality of channels 2. Thus, diffusions 2 are buried in epitaxial layer A. Epitaxial layer A is indicated as a P— type conductivity, indicating that it is of a lower conductivity than the P type columns. Epitaxial layer A can be boron-doped silicon with a conductivity of about 10–15 ohm-centimeters and may be, for example, 5 microns thick. Any well-known epitaxial process can be used to grow the illustrated epitaxial layer. During epitaxial growth of layer A, buried diffusions 2 will out-diffuse into epitaxial layer A and form first regions 2′, the boundaries of which are substantially defined by the first plurality of channels 2. Thus, it can be seen from FIG. 5 that epitaxial layer A is in contact with the columnar side of the capacitor and out-diffusions of the buried diffusions 2 begin the formation of the diffused semiconductor collars 24.

Figure 6:
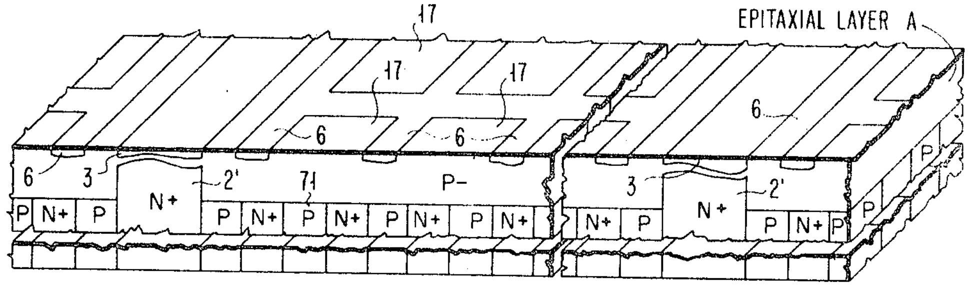
FIG. 6 is the same as FIG. 5 but showing the beginning of the low resistance, low inductance semiconductor paths and the continuation of the fabrication of the semiconductor collars.

Turning now to FIG. 6, second channels 3 of highly conductive semiconductor material of the same conductivity type as substrate 1 are then selectively diffused into the surface of epitaxial layer A in areas substantially coextensive with the areas of the first plurality of diffused channels 2. Typically, phosphorus can be used as a dopant. As will subsequently be seen, these channels 3 will diffuse into epitaxial layer A to form a continuous portion of the diffused collars. The conductivity of the diffused collar will be of approximately .010 ohm-centimeter.

With continued reference to FIG. 6, it is also seen that a plurality of third channels 6 of highly conductive semiconductor material of the same conductivity type as said first epitaxial layer, A, is selectively formed by diffusion of, say, boron into said first epitaxial layer in such a manner as to surround the regions 17. This pluarlity of third channels 6 will ultimately serve as the bottom portion of an isolation diffusion used to electrically separate components and will also comprise a large area, low resistance contact from the top surface of the chip to the P column contact to the decoupling capacitor. Without these low resisivity regions 6, in the range of approximately .01 ohm-centimeter, good contact to the capacitor could not be achieved since the resistivity of epitaxial layer A is normally 10–15 ohm-centimeters to afford low parasitic capacitance for the circuit elements to be fabricated in epitaxial layer B, discussed subsequently.

Figure 7:
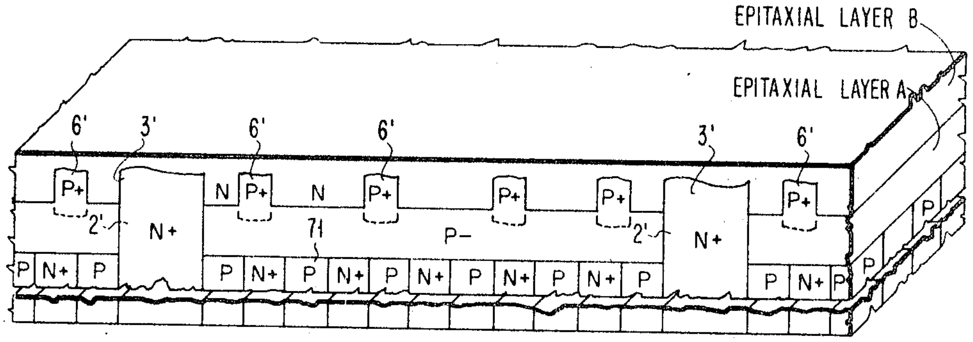
FIG. 7 is the same as FIG. 6 and additionally showing the formation of the second epitaxial layer and the continuation of the formation of the low resistance, low inductance paths and the diffused semiconductor collars.

Referring now to FIG. 7, the next step of the process comprises forming a second epitaxial layer, B, over the top of the semiconductor body thus far described. The second epitaxial layer can be arsenic doped silicon with a conductivity of approximately .1 ohm-centimeter and may be, for example, 5 microns thick. During growth of the second epitaxial layer, the plurality of channels 3 diffuse further into epitaxial layer A and out-diffuse into layer B to form continuous regions 3′ with said first regions 2′. Thus, it is seen that the diffused semiconductor collar is brought near to the top surface 25 of the semiconductor wafer. Likewise, channels 6 which were originally seen in FIG. 6, out-diffuse during growth of epitaxial layer B and also diffuse further into epitaxial layer A. The out-diffusion of channels 3 and 6 may be to the surface of epitaxial layer B, or may be only partially into layer B as shown in FIG. 7. It is preferable that the out-diffusion of channels 3 be only partially into layer B, so that a final diffusion can be made from the surface as described subsequently. This will give the semiconductor collar better resistivity characteristics. The above mentioned out-diffusion of region 6 forms regions 6′ included as part of the low resistance path from the circuits at the top of the chip to the capacitor.

Figure 8:
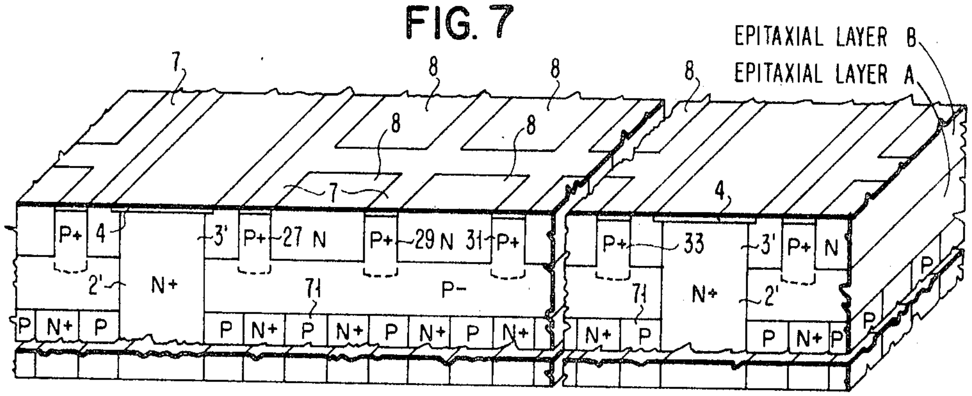
FIG. 8 is the same as FIG. 7 but additionally including the completion of the semiconductor paths and the diffused semiconductor collars.

With reference to FIG. 8, and for the situation in which channels 6 are not out-diffused completely to the surface of epitaxial layer B, a plurality of fourth channels 7 of highly conductive semiconductor material is selectively diffused into the surface of epitaxial layer B, in areas substantially coextensive with those of the diffused third plurality of channels 6. The conductivity type of the plurality of fourth channels is the same as that of the plurality of third channels 6 and the conductivities of both pluralities of channels are comparable, that is, approximately .01-ohm-centimeter. Thus, it can be seen that paths 27, 29, 31, 33 are formed from the top of the chip to the first epitaxial layer. These paths also form PN junctions for electrically isolating regions 8 of epitaxial layer B. Regions 8 may ultimately be used for fabricating circuit components, not shown, on the top surface of the integrated circuit chip, by any well-known process desired.

With continued reference to FIG. 8, and for the case in which out-diffused regions 3′ of FIG. 7 were not allowed to diffuse completely to the surface 25, a fifth plurality of channels 4 are formed by diffusion. This fifth plurality of channels are of the same conductivity type as the first plurality of channels and complete the diffused semiconductor collar from metallization 75 to the top 25 of the water. The material for diffusions 4 is of comparable conductivity to that of diffusions 3. It is desirable that diffusions 4 and 7 be the same diffusion used to form the circuit elements on the top 25 of the wafer in order to reduce processing steps.

Having now described the process for forming the columnar side of the capacitor and the contacts from the capacitor to the top surface of the chip, the following will describe the process steps for forming the indentations to the P type columns of the capacitor, and also the steps for including the dielectric therein and for forming the metallic plate side of the capacitor. It will be recalled from FIG. 4 that the top side 103 and the bottom side 105 of the substrate 1 were substantially planar surfaces. FIGS. 9 through 12, to preserve drawing clarity, will include only the bottom portion of the semiconductor structure of FIG. 8 showing an isometric view cutaway through the semiconductor collar and epitaxial layer A.

Figures 9, 10, 11, 12:
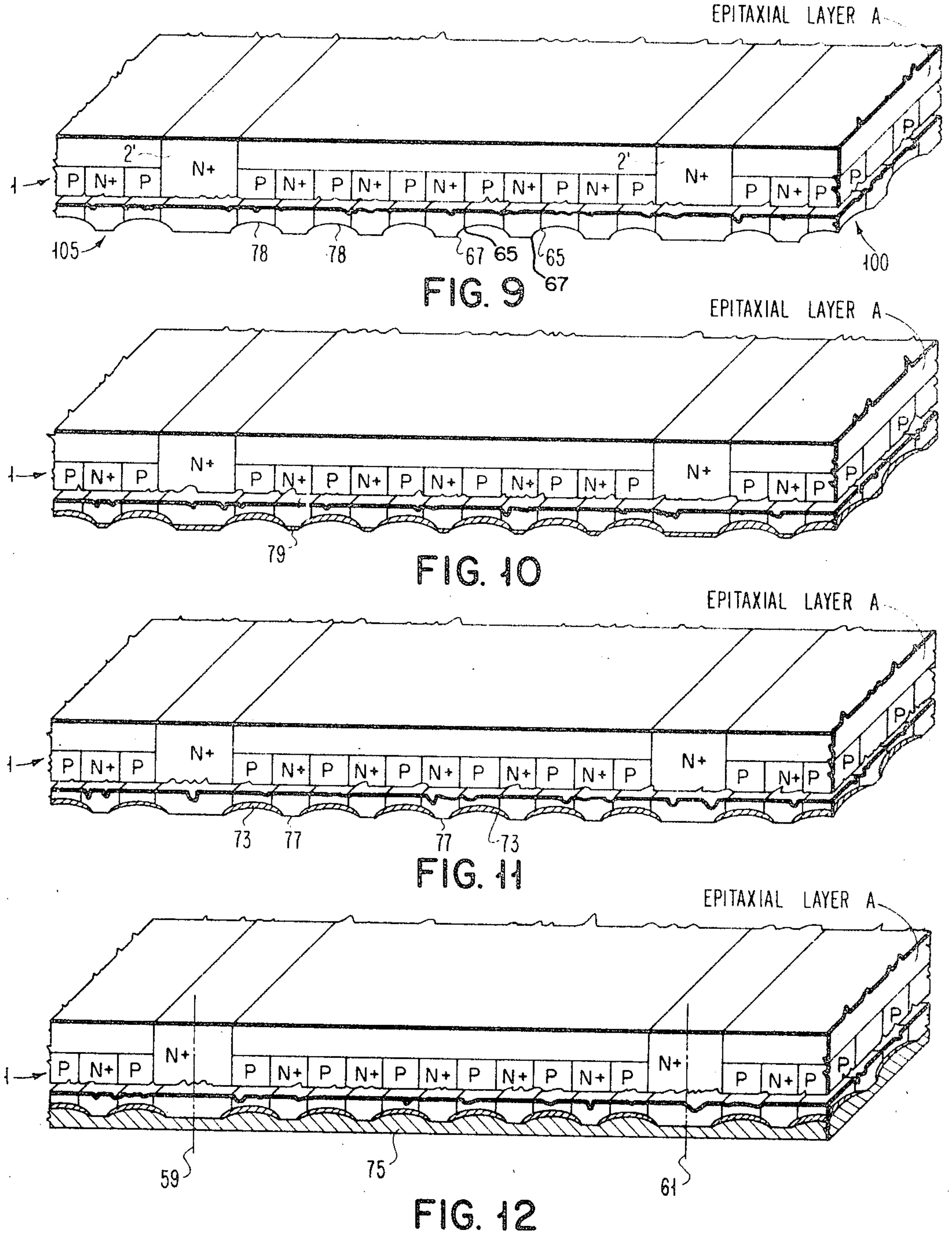
FIG. 9 shows the lower portion of the structure of FIG. 8 after the indentations have been formed.
FIG. 10 is the same as FIG. 9 but additionally showing the dielectric material over the bottom surface of the substrate.
FIG. 11 is the same as FIG. 10 but additionally showing the results of abrading the dielectric material from the planar surface of the bottom of the substrate.
FIG. 12 is the same as FIG. 11 but additionally showing the results of the metallization of the bottom side of the structure.

Referring now to FIG. 9, it is seen that indentations 78 are formed in the bottom planar surface 105 of the substrate such that individual ones of the indentations include individual ones of P type columns 71. As can be seen from the drawing, indentations 78 include not only P type columns 71, but also include portions of the N+ substrate surrounding individual ones of said columns. This is seen at 100, for example. The individual indentations may be circular in cross section when viewed from below surface 105, or may be of any desirable cross section. The series of depressions or indentations are such as to make the bottom surface 105 of the substrate appear like a waffle. Each depression should include enough the N+ substrate surrounding a P type column such that the PN junction such as 65 is well away from the edge 67 where the depression meets the planar surface 105 of the substrate. This will reduce the chances of edge shorts. The indentations may be formed by well-known etching techniques. In general, the indentations may be approximately 4 to 6 mils deep, in a 10 to 15 mil substrate such as that under discussion. To be effective, the depressions have to be a large percentage of the total thickness of the substrate 1 in order to achieve a reasonably low series resistance contact from the circuits on surface 25 to the columnar side of the capacitor.

The next step in the process is seen in FIG. 10. As seen in that figure, a layer 79 of dielectric material is deposited over the entire surface of the substrate including the indentations. It is preferable to deposit the dielectric by well-known evaporation techniques. Slurry deposition techniques could also be used. The dielectric material may be any well-known dielectric, according to designer's choice. In order to achieve high values of capacitance, barium titanate or tantalum oxide can be used, each of which has a high dielectric constant.

The next step of the process is seen in FIG. 11. As seen in this figure, the dielectric material has been abraded from the ridges 77 of the surrounding N+ substrate, leaving these ridges substantially dielectric-free. Lapping is preferable for this step but other well-known techniques such as etching may be used. As seen in FIG. 11, this step leaves dielectric material 73 substantially only in the indentations.

As seen from FIG. 12, the next step in the process is to deposit a metallic film 75 over the bottom of the structure. This metallic film 75 will serve as a plate of the capacitor and as the joining media from the N ridges 77 to a metal substrate 15 seen in FIG. 1. The process for metallizing the bottom may be by evaporation of gold, for example, including a sintering operation to form a gold-silicon eutectic. It will be appreciated that the ridges give good thermal and mechanical contact. Generally, thin film capacitors which have one side of the capacitor reasonably close to the circuits on the integrated circuit chip would seriously weaken the semiconductor body. The present novel structure and process evades this danger by etching a series of depressions to orient the capacitor close to the circuits at the top of the chip, while leaving ridges 77 to maintain the mechanical strength of the chip. This gives the result of achieving a capacitor which is located physically near the circuits at the top of the chip but does not greatly increase the fragility of the chip or wafer. As seen from FIG. 12, many of the prescribed integrated chips can be made from a single wafer. Individual integrated circuit chips can be scribed and cut from the wafer along lines such as 59, 61. The metal substrate 15, seen in FIG. 1, can be bonded to the metallic film 75 after the chip has been cut from the wafer, and can be connected to the V+ power supply.

As an alternative process to that described, involving buried diffusions and controlled out-diffusions for making the paths 27, 29, 31, 33 from the top of the integrated circuit chip to epitaxial layer A, it will be recognized by those skilled in the art that these paths can also be made by diffusing from the top surface of epitaxial layer B into epitaxial layer A.

The foregoing has described the structure of, and process of making, a thin film capacitor incorporated in an integrated circuit chip. It will be appreciated by those skilled in the art that the P— region of eqitaxial layer A serves as a contact to the P columnar side of the capacitor. The P regions 27, 29, 31, 33 serve as low series resistance paths to the P— contact, and circuit points to be decoupled can therefore be connected to the paths 27, 29, 31, 33 at the top surface 25 of the integrated circuit chip. Since the P— region is of low conductivity, in the order of 10 to 15 ohms-centimeters and is very thin, in the order of 5 microns, series resistance across the capacitor is quite low due to the very large area of the contact and very short path to the top surface 25. While the invention has been particularly shown and described with reference to a preferred embodiment, it will be understood by those skilled in the art that the foregoing and other changes in form and detail may be made without departing from the spirit and scope of the invention.

We claim:

1. A a thin film decoupling capacitor incorporated in an integrated circuit chip wherein circuits are arranged at the top surface of said chip, comprising in combination:

semiconductor regions of a first conductivity type embedded in a substrate of a second conductivity type, said substrate having indentation at one surface, each indentation including one of said semiconductor regions;

dielectric material deposited in said indentations; and a metallic thin film in contact with said dielectric material and with portions of said one surface of said substrate.

2. The device of claim 1 further including a low resistance path from said semiconductor regions to said top surface of said chip.

3. A thin film capacitor incorporated in an integrated circuit chip wherein the circuits are located on the top surface of the chip, comprising in combination:

a semiconductor substrate of a given conductivity type, said substrate having a top surface and a bottom surface, said bottom surface having indentations;

semiconductor regions of opposite conductivity type to that of said substrate, each of said regions embedded in said substrate and extending from said top surface to one of said indentations in said bottom surface;

dielectric film within each said indentations and covering that part of said semiconductor region within each said indentations;

a metallic film in contact both with said dielectric film and with predetermined areas of said bottom surface;

a semiconductor layer formed over the top of said substrate;

component islands formed over the top of said semiconductor layer and included in said top surface of said chip, said islands electrically isolated by a first low resistance path from the top surface of said chip to said semiconductor layer; and second low resistance paths from said substrate to said top surface of said chip.

4. The thin film capacitor incorporated in an integrated chip according to claim 3 further including:

a metallic substrate, for connection to a first power supply, conductively bonded to said metallic film; and metallized areas on said top surfaces of said chip in areas included in said first low resistance path, said metallized areas for connection to a second power supply.

5. The semiconductor combination of claim 4 wherein said semiconductor layer is an epitaxially grown semiconductor layer.

6. The semiconductor device of claim 5 wherein said component islands comprise portions of a second epitaxially grown semiconductor layer.

7. The semiconductor device of claim 6 wherein said low resistance path from said substrate to said top surface of said chip comprises a diffused semiconductor collar about the periphery of said chip.

8. A thin film decoupling capacitor incorporated in an integrated circuit chip, comprising in combination:

a semiconductor substrate of a given conductivity type, having first and second surfaces, said substrate having embedded therein semiconductor columns of opposite conductivity type to that of said substrate;

indented areas in said second surface, said indented areas each including part of at least one of said semiconductor columns and parts of said substrate surrounding said at least one of said semiconductor columns;

dielectric material contained in said indented areas such that parts of said second surface of said semiconductor substrate are substantially free of said dielectric material;

a metallic film in contact with said dielectric material and with said parts of said second surface of said semiconductor substrate which are substantially free of dielectric material;

a first layer of semiconductor material in contact with said semiconductor columns at said first surface of said semiconductor substrate, said semiconductor material being of the same conductivity type as said semiconductor columns;

a second layer of semiconductor material forming a top surface of said chip, said second layer in contact with said first layer of semiconductor material and of opposite conductivity type thereto;

a low resistance path from said top surface of said chip to said semiconductor columns; and at least one low resistance path from said metallic thin film to said top surface of said chip.

9. The device of claim 8 further including the metallic substrate conductively bonded to said metallic film, said metallic substrate for connection to a first power supply.

10. A thin film decoupling capacitor incorporated in an integrated circuit chip, comprising in combination:

a semiconductor substrate of a given conductivity type, said substrate having first and second surfaces;

semiconductor columns of a conductivity type opposite to that of said substrate, embedded in said substrate and extending from said first surface;

indented areas in said second surface, said indented areas each including an area of one of said semiconductor columns and an area of said substrate surrounding said one of said semiconductor columns such that said second surface includes ridges of the material of said substrate;

dielectric material included in said indented areas but not included on at least a portion of said ridges;

a metallic film in contact with said dielectric material and also with said portion of said ridges;

a first layer of epitaxially grown semiconductor material of the same conductivity type as said semiconductor columns in contact with said first surface of said substrate;

a second layer of epitaxially grown semiconductor material of opposite conductivity type to said semiconductor columns, said second layer forming a top surface of said chip and being in contact with said first layer;

a low resistance path from said top surface to said semiconductor columns; and at least one low resistance path from said top surface to said metallic film.

11. The device of claim 10 further including a metallic substrate conductively bonded to said metallic film, said metallic substrate for connection to a power supply.

12. The device of claim 11 further including means for connecting a second power supply to said top surface of said chip.

13. The process of fabricating a thin film decoupling capacitor incorporated in an integrated circuit chip, comprising the steps of:

(a) obtaining a highly conductive semiconductor substrate of a first semiconductor type, having a top and a bottom surface;

(b) forming semiconductor columns of a second conductivity type in said semiconductor substrates, said columns extending from said first surface;

(c) forming a first semiconductor layer of said second conductivity type over said top surface of said substrate and a second semiconductor layer of said conductivity type over said first layer, while concurrently forming a plurality of low resistance semiconductor paths from said substrate to the top of said second semiconductor layer;

(d) forming in said second semiconductor layer a plurality of low resistance paths from the top of said second semiconductor layer to said semiconductor columns;

(e) forming indentations in said second surface of said substrate, such that individual ones of said indentations included areas of individual ones of said columns;

(f) depositing a layer of dielectric material over said second surface, including said indented areas;

(g) selectively abrading said dielectric material such that each said indented area contains a deposited portion of said dielectric material and said surface of said substrate not included in said depressions is substantially free of dielectric material; and (h) metallizing the bottom surface of the thusly formed body so as to form a metallic plane which is in contact with both said dielectric material in said indented areas and said substantially free material of said second surface of said semiconductor substrate.

14. The process of incorporating a thin film capacitor in an integrated circuit chip, including the steps of:

(a) obtaining a high conductivity substrate having a top side and a bottom side, said substrate being of a given conductivity type;

(b) diffusing columns of semiconductor material of a conductivity type opposite to that of said substrate into said substrate to form embedded columns within said substrate;

(c) diffusing first channels of highly conductive semiconductor material of said given conductivity type into said substrate in areas not included said diffused columns;

(d) forming a first epitaxial layer of semiconductor material on said first surface of said substrate, inincluding said areas affected by said last named diffusion step, said first epitaxial layer being of the same conductivity type as that of said diffused columns, and concurrently allowing said diffused first channels to out-diffuse into parts of said epitaxial layer;

(e) selectively diffusing second channels of highly conductive semiconductor material, of the same conductivity type as said substrate, into the surface of said first epitaxial layer in areas substantially coextensive with the area of said first diffused channels;

(f) selectively diffusing a plurality of third channels of highly conductive semiconductor material, of the same conductivity type as said first epitaxial layer, in such a manner as to surround the regions of said first epitaxial layer;

(g) forming a second epitaxial layer of semiconductor material on the semiconductor body formed by said last named step, said epitaxial layer being of opposite conductivity type to that of said first epitaxial layer, and concurrently allowing said second channels to out-diffuse into said second epitaxial layer and to diffuse into said first epitaxial layer to form continuous regions with said out-diffused portions of said first channels, while also concurrently allowing said plurality of third channels to diffuse into said first epitaxial layer and to out-diffuse into said second epitaxial layer;

(h) selectively diffusing into the surface of said second epitaxial layer a plurality of fourth channels of semiconductor material, of the same conductivity type as said plurality of third channels, in areas substantially coextensive with the areas of said plurality of third channels to form low resistance paths from said first epitaxial layer to the top surface of said second epitaxial layer;

(i) selectively diffusing into the surface of said second epitaxial layer fifth channels of a highly conductive semiconductor material of the same conductivity type as said first channels to complete low resistance paths from the top of said second epitaxial layer to said substrate;

(j) etching indentations in said second side of said substrate such that each indentation includes one of said diffused semiconductor columns and portions of said substrate surrounding said one of said one of diffused semiconductor columns;

(k) depositing a dielectric material over the second surface of said substrate including said indentations;

(l) lapping said dielectric material to expose areas of said substrate, such that each said indentation contains a portion of said dielectric material; and (m) metallizing said bottom surface such that said contained portions of said dielectric material and said exposed areas of said substrate are in contact with said metal.

References Cited

UNITED STATES PATENTS

| | | | |
|---|---|---|---|
| 3,333,326 | 8/1967 | Thomas et al. | |
| 3,393,349 | 7/1968 | Huffman. | |
| 3,401,450 | 9/1968 | Godejahn ------- | 317—234 X |

JAMES D. KALLAM, Primary Examiner

U.S. Cl. X.R.

29—576; 317—101